United States Patent
Choi et al.

[11] Patent Number: 5,809,553
[45] Date of Patent: Sep. 15, 1998

[54] NONVOLATILE MEMORY DEVICES INCLUDING LOCKABLE WORD LINE CELLS

[75] Inventors: Do-Chan Choi, Seoul; Jong-Chang Son, Kyungki-do, both of Rep. of Korea

[73] Assignee: Samsung Electronics Co., Ltd., Suwon, Rep. of Korea

[21] Appl. No.: 770,260

[22] Filed: Dec. 20, 1996

[30]  Foreign Application Priority Data

Dec. 22, 1995 [KR]  Rep. of Korea ................... 1995/54754

[51] Int. Cl.[6] ....................................................... G06F 12/00
[52] U.S. Cl. ..................... 711/170; 711/103; 365/185.09; 365/185.11; 365/185.13; 365/218; 365/195
[58] Field of Search ............................... 365/185.13, 218, 365/185.17, 185.11, 185.09, 185.22, 185.23, 185.33, 200, 185; 711/103, 170

[56]  References Cited

U.S. PATENT DOCUMENTS

| | | | |
|---|---|---|---|
| 5,270,967 | 12/1993 | Moazzami et al. | 365/145 |
| 5,274,599 | 12/1993 | Ema | 365/185.22 |
| 5,513,136 | 4/1996 | Fandrich et al. | 365/185.04 |
| 5,737,258 | 7/1998 | Choi et al. | 365/63 |

*Primary Examiner*—Tod R. Swann
*Assistant Examiner*—Mehdi Namazi
*Attorney, Agent, or Firm*—Myers Bigel Sibley & Sajovec

[57]  ABSTRACT

Nonvolatile memory devices and methods include an array of nonvolatile memory cells which are arranged in a plurality of rows and a plurality of columns. A plurality of word lines are also included, a respective one of which is connected to the nonvolatile memory cells in a respective one of a plurality of columns. A plurality of lockable cells are also included. A respective one of the lockable cells is connected to a respective one of the plurality of word lines. Each of the lockable cells stores therein a first or a second binary value. The first binary value indicates that nonvolatile memory cells which are connected to the corresponding column of word lines cannot be erased or reprogrammed. The second binary value indicates that nonvolatile memory cells which are connected to the corresponding column of words lines can be erased or programmed.

19 Claims, 3 Drawing Sheets

NONVOLATILE MEMORY DEVICES INCLUDING LOCKABLE WORD LINE CELLS

FIELD OF THE INVENTION

This invention relates to integrated circuit memory devices, and more particularly to nonvolatile integrated circuit memory devices.

BACKGROUND OF THE INVENTION

Nonvolatile integrated circuit memory devices such as electrically erasable and programmable read only memories (EEPROM) are widely used for program storage and other applications. In erasing or programming nonvolatile memory devices, the user often desires that memory cells should not be erased or programmed, in order to protect the data which is stored therein.

Accordingly, it is known to lock out or block erasing or programming of an entire nonvolatile memory device. Moreover, nonvolatile memory devices may be arranged in blocks, each of which includes an array of nonvolatile memory cells arranged in a plurality of rows and a plurality of columns. In this arrangement, it is also known to lock selected blocks of cells. Thus, when the entire device or a block thereof is blocked, erasure and/or reprogramming is prevented despite the receipt of a program or erase command. This locking operation is also referred to as a "lockable block".

SUMMARY OF THE INVENTION

The present invention provides nonvolatile memory devices and operational methods which allow locking and unlocking on a "per word line" basis. Thus, the nonvolatile memory cells which are connected to a selected word line can be locked or unlocked, so that they can be programmed and erased or cannot be programmed and erased. By not requiring locking on a block basis, high speed erase locking can be provided. Moreover, only those cells which are necessary to lock or unlock need be locked or unlocked. In contrast, in conventional memory devices as described, an entire device or block is locked or unlocked simultaneously.

Nonvolatile memory devices and methods according to the invention include an array of nonvolatile memory cells which are arranged in a plurality of rows and a plurality of columns. It will be understood by those having skill in the art that the terms "rows" and "columns" are used herein to indicate orthogonal directions in an array and are not used to indicate a specific horizontal or vertical direction in the array. Nonvolatile memory devices according to the invention also include a plurality of word lines, a respective one of which is connected to the nonvolatile memory cells in a respective one of a plurality of columns. It will be understood that the term "word line" is used to indicate a line which connects the cells in a given direction.

Nonvolatile memory devices according to the invention also include a plurality of lockable cells. A respective one of the lockable cells is connected to a respective one of the plurality of word lines. Each of the lockable cells stores therein a first or a second binary value. The first binary value indicates that nonvolatile memory cells which are connected to the corresponding column of word lines cannot be erased or programmed. The second binary value indicates that nonvolatile memory cells which are connected to the corresponding column of words lines can be erased or programmed.

Nonvolatile memory devices according to the invention include a controller and/or controlling methods which are responsive to an erase or program command for the array of nonvolatile memory cells and which prevent erasure or programming of a column of nonvolatile memory cells if the lockable cell corresponding to the column of nonvolatile memory cells stores therein the first binary value. In contrast, erasure or programming of a column of nonvolatile memory cells is allowed if the lockable cell corresponding to the column of nonvolatile memory cells stores therein the second binary value.

Nonvolatile memory devices and methods according to the invention are also responsive to an erase lock command for a selected word line to store the first binary value in the lockable cell corresponding to the selected word line. Nonvolatile memory devices and methods according to the invention are also responsive to an erase unlock command for a selected word line, to store the second binary value in the lockable cell corresponding to the selected word line. It will be understood that rather than merely allowing erasure or programming of a column of nonvolatile cells if the lockable cell corresponding to the column of nonvolatile cells stores therein the second binary value, the column of nonvolatile cells may actually be erased or programmed if the lockable cell stores therein the second binary value.

In preferred embodiments of nonvolatile memory devices according to the invention, each of the nonvolatile memory cells and lockable cells includes a control gate. The control gates of the plurality of nonvolatile memory cells and the lockable cell in a respective column are connected to the corresponding word line.

According to other aspects of the present invention, the nonvolatile memory devices are responsive to the erase lock command to first erase and program the column of nonvolatile memory cells corresponding to the selected word line and then store the first binary value in the lockable cell corresponding to the selected word line. Similarly, the nonvolatile memory devices are responsive to the erase unlock command, to erase and program the column of nonvolatile memory cells and to store the second binary value in the lockable cell corresponding to the selected word line.

In preferred embodiments of the present invention, a sense buffer is included to store therein the binary values which are stored in a plurality of locked cells. The controller is responsive to the sense buffer. Accordingly, memory cells may be locked and unlocked on a "per word line" basis, so that high speed programming operations may be performed and undesired cells are not inadvertently erased or programmed.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In general, in electrically erasable and programmable nonvolatile memory devices, an erase operation is performed before a program operation is performed. Thus, a program lock operation generally is automatically performed when an erase lock operation is performed.

Figure 1:
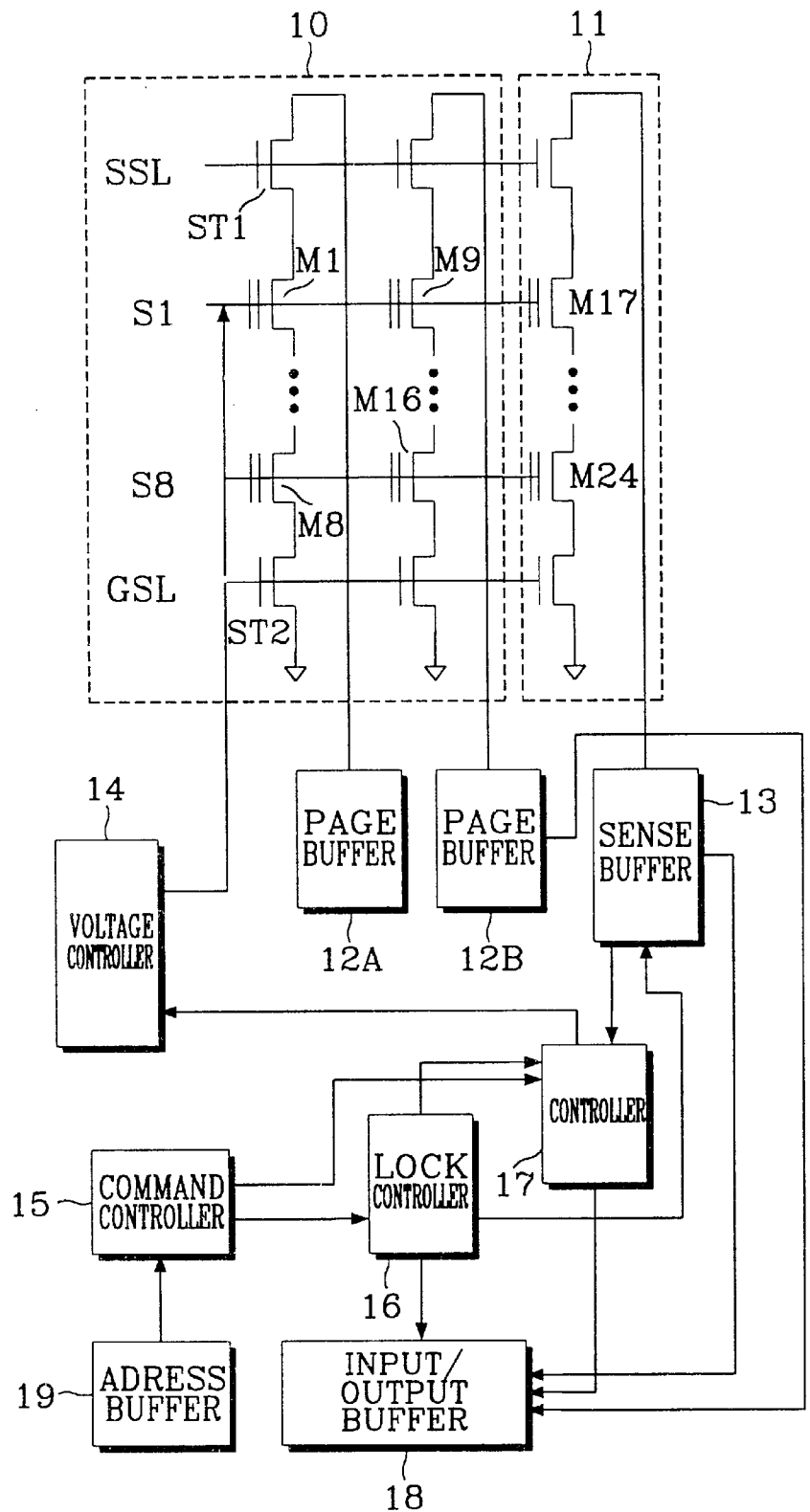
FIG. 1 is a schematic block diagram of nonvolatile memory devices according to the present invention.

FIG. 1 is a schematic block diagram illustrating nonvolatile memory devices according to the present invention. As shown in FIG. 1, the nonvolatile semiconductor memory devices comprise a memory cell array 10 including memory cells, for example 32 megabits (4,096×8,192) which are arranged in the form of an array or matrix, for example of 4,096 rows and 8,192 columns. The control gates of the memory cells in each column are connected to 4,096 word lines, respectively. Also, the drains of the memory cells in each row are connected to 8,192 bit lines, respectively.

For ease of illustration, FIG. 1 shows only one block of the memory cell array 10 which includes two columns connected to two bit lines, respectively. A NAND cell unit in each column, connected to a corresponding bit line, is provided with first and second selection transistors ST1 and ST2, and eight memory cells M1–M8 or M9–M16 connected in series between a source of the first selection transistor ST1 and a drain of the second selection transistor ST2.

The first selection transistor ST1 in each NAND cell unit has its drain connected to the corresponding bit line through a resistor connection (not shown). The second selection transistor ST2 in each NAND cell unit has its source connected to a ground voltage source or common source line CSL. In each NAND cell unit, the first selection transistor ST1 has its gate connected to a first selection line SSL and the second selection transistor ST2 has its gate connected to a second selection line GSL. Also, the memory cells M1–M8 or M9–M16 have their control gates connected respectively to word lines WL1–WL8.

According to the invention, a lockable cell unit 11, which is illustrated as a NAND cell unit in another column, is also included. The lockable cell unit 11 is preferably the same in construction as the memory cell units. Memory cells M17–M24 in the lockable cell unit 11 will be referred to hereinafter as "lockable cells", and the remaining memory cells M1–M16 will be referred to hereinafter as "normal cells". The design of the NAND cell units in the memory cell array 10 is well known to those having skill in the art and need not be described further herein.

Operation of nonvolatile memory devices in accordance with the present invention will now be described in detail with reference to FIGS. 2 to 4.

Figure 2:
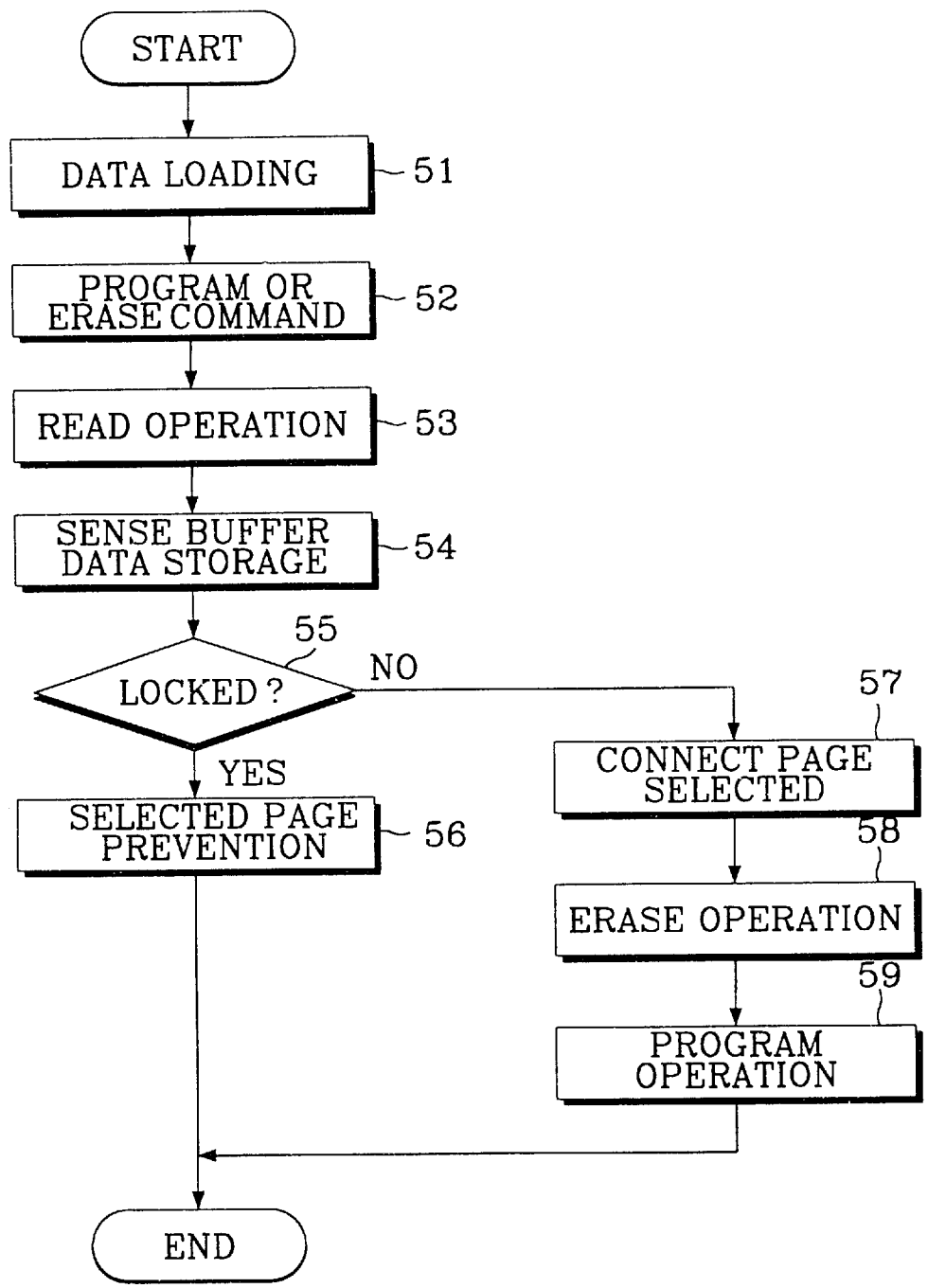
FIG. 2 is a flow chart illustrating operations of nonvolatile memory devices according to the present invention in response to program or erase commands.

FIG. 2 is a flow chart which illustrates program operations for nonvolatile memory devices of FIG. 1. Upon receiving an address to be programmed from an address buffer 19 (block 51), a command control circuit 15 combines bits of the received address to produce a program command (block 52). In response to the produced program command, the command control circuit 15 drives a lock control circuit 16 to read data (block 53) from a lockable cell of a selected word line corresponding to the received address through a sense buffer 13 which is connected to the bit line of the lockable cell unit 11. A voltage control circuit 14 is driven under control of a control circuit 17 to supply a read voltage Vread to the selected word line. As a result, data from the lockable cell of the selected word line is stored in the sense buffer 13, and data from normal cells of the selected word line are stored in page buffers 12A and 12B, respectively (block 54).

If the read data from the lockable cell of the selected word line (block 55) is 0, the lockable cell is an ON cell and the lock control circuit 16 determines that the normal cells of the selected word line have been erase-locked. Programming is thereby prevented (block 56). In contrast, if the read data from the lockable cell of the selected word line is 1, the lockable cell is an OFF cell, and the lock control circuit 16 determines that the normal cells of the selected word line are not erase-locked. As a result, in this case, the normal cells of the selected word line can be programmed, by selecting the cells (block 57), erasing the cells (block 58) and programming the cells (block 59).

Figure 3:
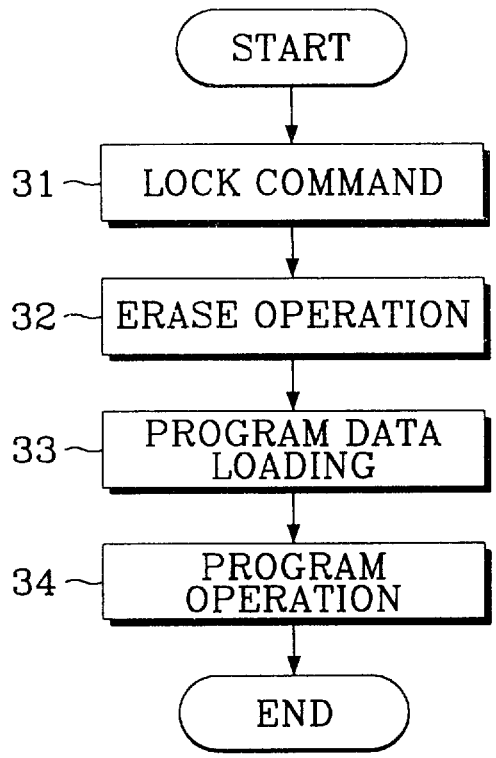
FIG. 3 is a flow chart illustrating operations of nonvolatile memory devices according to the invention in response to lock commands.

FIG. 3 is a flow chart illustrating erase lock operations of nonvolatile memory devices of FIG. 1. Upon receiving an address to be locked, from the address buffer 19, the command control circuit 15 combines bits of the received address to produce a lock command (block 31). In response to the produced lock command, the command control circuit 15 applies an erase command to the lock control circuit 16 to drive it. When driven, the lock control circuit 16 drives the control circuit 17 to control the voltage control circuit 14. Under the control of the control circuit 17, the voltage control circuit 14 produces an erase voltage Vera.

Generally, lockable and normal cells of a selected word line corresponding to the received address are first erased and programmed before they are locked. As a result, the voltage control circuit 14 supplies a ground voltage Vss to gates of the lockable and normal cells of the selected word line and produces an erase voltage Vera to the substrate, to erase the lockable and normal cells of the selected word line (block 32). All memory cells of word lines which are not selected, enter a floating state. The erase operation is advanced in this manner. As a result, the lockable cell of the selected word line becomes an ON cell.

Then, since the lockable cell of the selected word line is an ON cell, the command control circuit 15 produces the program command to program the lockable and normal cells of the selected word line (blocks 33 and 34). As a result, the voltage control circuit 14 supplies a program voltage Vpgm to the gates of the lockable and normal cells of the selected word line, and supplies ground voltage Vss to the substrate to program the lockable and normal cells of the selected word line. Also, the voltage control circuit 14 applies an inhibit voltage Vinh at supply voltage level Vcc to the bit line of the lockable cell of the selected word line. Therefore, the normal cells of the selected word line are locked because the lockable cell of the selected word line is programmed together with the normal cells when the inhibit voltage Vinh is applied to the bit line of the lockable cell. At this time, the inhibit voltage Vinh is applied to the bit line of the lockable cell of the selected word line to allow the lockable cell to remain at its ON cell state.

In more detail, first, the command control circuit 15 receives an address to be locked, from the address buffer 19, and an input/output buffer 18 inputs data to be programmed. The command control circuit 15 combines bits of the received address to produce the lock command. In response to the produced lock command, the command control circuit 15 applies the erase command to the lock control circuit 16 to drive it. The lock control circuit 16 drives the control circuit 17 to control the voltage control circuit 14. Under the control of the control circuit 17, the voltage control circuit 14 supplies ground voltage Vss to gates of lockable and normal cells of a selected word line corresponding to the received address, and supplies the erase voltage Vera to the substrate to erase the lockable and normal cells of the selected word line. All memory cells of word lines which are not selected, enter a floating state. As a result, the lockable cell of the selected word line becomes an ON cell.

For example, assume that the normal and lockable cells M1, M9 and M17 of the word line WL1 are to be programmed respectively with data 1, 0 and 0 and then locked, where the lockable cell M17 is an OFF cell if data therein is 1 and an ON cell if the data therein is 0. First, the command control circuit 15 receives an address corresponding to the selected word line WL1 from the address buffer 19, and the input/output buffer 18 inputs the data to be programmed. The command control circuit 15 combines bits of the received address to produce the lock command. In response to the produced lock command, the command control circuit 15 applies the erase command to the lock control circuit 16 to drive it. The lock control circuit 16 drives the control circuit 17 to control the voltage control circuit 14. Under the control of the control circuit 17, the voltage control circuit 14 supplies ground voltage Vss to the gates of the normal and lockable cells M1, M9 and M17 of the word line WL1, and supplies the erase voltage Vera to the substrate to erase the normal and lockable cells M1, M9 and M17. All the memory cells of the word lines WL2–WL8, not selected, enter a floating state. As a result, the lockable cell M17 of the word line WL1 becomes an ON cell.

Then, since the lockable cell M17 of the word line WL1 is an ON cell, the command control circuit 15 produces the program command to program the lockable and normal cells of the selected word line. As a result, the lock control circuit 16 transfers the program data from the input/output buffer 18 to the bit lines of the normal and lockable cells M1, M9 and M17 of the word line WL1, and the voltage control circuit 14 supplies the program voltage Vpgm to the gates of the normal and lockable cells M1, M9 and M17 of the word line WL1, and supplies ground voltage Vss to the substrate to program the normal and lockable cells M1, M9 and M17. Also, the voltage control circuit 14 applies the inhibit voltage Vinh, at power supply voltage level Vcc, to the bit line of the lockable cell M17. Further, the voltage control circuit 14 applies a pass voltage Vpass to the word lines WL2–WL8 which are not selected. Therefore, the normal cells M1 and M9 of the word line WL1 are locked because the lockable cell M17 of the word line WL1 is programmed together with the normal cells M1 and M9 under the condition that the inhibit voltage Vinh is applied to the bit line of the lockable cell M17. At this time, the inhibit voltage Vinh is applied to the bit line of the lockable cell M17 to allow the lockable cell M17 to remain at its ON cell state.

Figure 4:
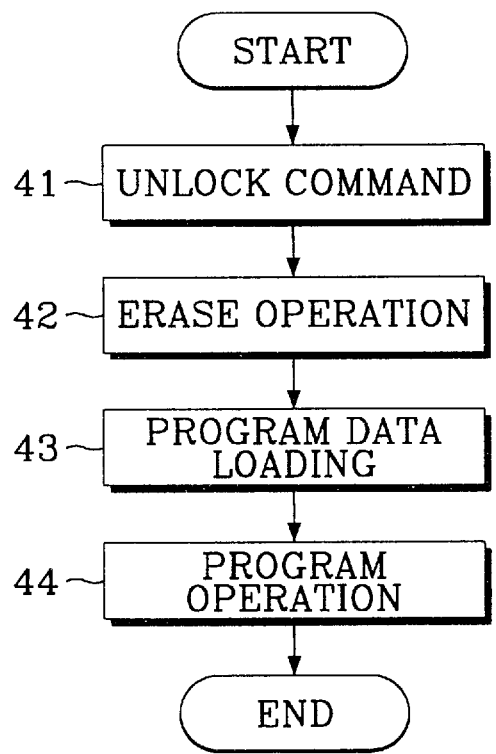
FIG. 4 is a flow chart illustrating operations of nonvolatile memory devices according to the invention in response to unlock commands.

FIG. 4 is a flow chart illustrating erase unlock operations of nonvolatile memory devices of FIG. 1. The erase unlock operation is performed in a similar manner to the erase lock operation in FIG. 3. First, the command control circuit 15 receives an address to be unlocked, from the address buffer 19, and the input/output buffer 18 inputs data to be programmed. The command control circuit 15 combines bits of the received address to produce an unlock command (block 41). In response to the produced unlock command, the command control circuit 15 applies the erase command to the lock control circuit 16 to drive it. When driven, the lock control circuit 16 drives the control circuit 17 to control the voltage control circuit 14. Under the control of the control circuit 17, the voltage control circuit 14 produces the erase voltage Vera.

Generally, lockable and normal cells of a selected word line corresponding to the received address are first erased and programmed before they are unlocked. As a result, the voltage control circuit 14 supplies the ground voltage Vss to gates of the lockable and normal cells of the selected word line, and produces an erase voltage Vera to the substrate to erase the lockable and normal cells of the selected word line (block 42). All memory cells of word lines which are not selected, enter a floating state. The erase operation is advanced in this manner.

Then, once the lockable cell of the selected word line is an ON cell, the command control circuit 15 produces the program command to program the lockable and normal cells of the selected word line. As a result, the lock control circuit 16 transfers the program data from the input/output buffer 18 to the bits lines of the lockable and normal cells of the selected word line (block 43), and the voltage control circuit 14 supplies the program voltage Vpgm to the gates of the lockable and normal cells of the selected word line and supplies ground voltage Vss to the substrate to program the lockable and normal cells of the selected word line (block 44). Also, the voltage control circuit 14 applies the ground voltage Vss to the bit line of the lockable cell of the selected word line. Therefore, the lockable cell of the selected word line becomes an OFF cell and the normal cells of the selected word line are unlocked. In other words, the normal cells of the selected word line are unlocked because the lockable cell of the selected word line is programmed together with the normal cells when ground voltage is applied to the bit line of the lockable cell. At this time, the ground voltage Vss is applied to the bit line of the lockable cell of the selected word line to change the present state of the lockable cell from its ON cell state to its OFF cell state.

For example, assume that the normal and lockable cells M1, M9 and M17 of the word line WL1 are to be programmed respectively with data 1, 0 and 1 and then unlocked, where the lockable cell M17 is an OFF cell if data therein is 1 and an ON cell if the data therein is 0. The command control circuit 15 receives an address corresponding to the selected word line WL1 from the address buffer 19, and the input/output buffer 18 inputs the data to be programmed. The command control circuit 15 combines bits of the received address to produce the unlock command. In response to the produced unlock command, the command control circuit 15 applies the erase command to the lock control circuit 16 to drive it. The lock control circuit 16 drives the control circuit 17 to control the voltage control circuit 14. Under the control of the control circuit 17, the voltage control circuit 14 supplies ground voltage Vss to the gates of the normal and lockable cells M1, M9 and M17 of the word line WL1 and supplies the erase voltage Vera to the substrate to erase the normal and lockable cells M1, M9 and M17. All the memory cells of the word lines WL2–WL8 which are not selected, enter a floating state.

Then, since the lockable cell M17 of the word line WL1 is an ON cell, the command control circuit 15 produces the program command to program the lockable and normal cells of the selected word line. As a result, the lock control circuit 16 transfers the program data from the input/output buffer 18 to the bit lines of the normal and lockable cells M1, M9 and M17 of the word line WL1, and the voltage control circuit 14 supplies the program voltage Vpgm to the gates of the normal and lockable cells M1, M9 and M17 of the word line WL1, and supplies ground voltage Vss to the substrate to program the normal and lockable cells M1, M9 and M17.

At this time, the lockable cell M17 of the word line WL1 is programmed with data 1 so that it can become an OFF cell. Also, the ground voltage Vss is applied to the bit line of the lockable cell M17 to change the present state of the lockable cell M17 from its ON cell state to its OFF cell state. Therefore, the normal cells M1 and M9 of the selected word line WL1 are unlocked.

As described above, the lock control circuit 16 reads data from the lockable cell of the selected word line during the program operation to float the selected word line if it has been locked as a result of the data reading, and to program the selected word line if it is not locked as a result of the data reading. The voltage control circuit 14 sequentially generates the erase voltage and the program voltage in response to the lock or unlock command from the command control circuit 15. Thus, an erase prevention operation is performed in the unit of word line or page. Therefore, a reduced time may be used in performing the erase prevention operation.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A nonvolatile memory device comprising:

an array of nonvolatile memory cells arranged in a plurality of rows and a plurality of columns;

a plurality of word lines, a respective one of which is connected to the nonvolatile memory cells in a respective one of the plurality of columns;

a plurality of lockable cells, a respective one of which is connected to a respective one of the plurality of word lines, each of the lockable cells storing therein a first binary value, which indicates that the nonvolatile memory cells which are connected to the corresponding column of word lines cannot be erased or reprogrammed, or a second binary value which indicates that the nonvolatile memory cells which are connected to the corresponding column of word lines can be erased or programmed; and a controller which is responsive to an erase or program command, and which prevents erasure or programming of a column of nonvolatile memory cells if the lockable cell corresponding to the column of nonvolatile memory cells stores therein the first binary value, and which allows erasure or programming of a column of nonvolatile memory cells if the lockable cell corresponding to the column of nonvolatile memory cells stores therein the second binary value.

2. A nonvolatile memory device according to claim 1 wherein the controller is also responsive to an erase lock command for a selected word line, to store the first binary value in the lockable cell corresponding to the selected word line.

3. A nonvolatile memory device according to claim 2 wherein the controller is also responsive to an erase unlock command for a selected word line, to store the second binary value in the lockable cell corresponding to the selected word line.

4. A nonvolatile memory device according to claim 1 wherein the controller prevents erasure or programming of a column of nonvolatile memory cells if the lockable cell corresponding to the column of nonvolatile memory cells stores therein the first binary value, and erases or programs a column of nonvolatile memory cells if the lockable cell corresponding to the column of nonvolatile memory cells stores therein the second binary value.

5. A nonvolatile memory device according to claim 1 wherein each of the nonvolatile memory cells and lockable cells includes a control gate, and wherein the control gates of the plurality of nonvolatile memory cells and the lockable cell in a respective column are connected to the corresponding word line.

6. A nonvolatile memory device according to claim 2 wherein the controller is also responsive to the erase lock command to perform the following step prior to the step of storing the first binary value in the lockable cell corresponding to the selected word line:

erasing and programming the column of nonvolatile memory cells corresponding to the selected word line.

7. A nonvolatile memory device according to claim 3 wherein the controller is also responsive to the erase unlock command to perform the following step:

erasing and programming the column of nonvolatile memory cells corresponding to the selected word line.

8. A nonvolatile memory device according to claim 1 wherein the controller comprises:

a sense buffer which stores therein the binary values which are stored in the plurality of lockable cells; and wherein the controller is responsive to the sense buffer.

9. A locking method for a nonvolatile memory device including an array of nonvolatile memory cells arranged in a plurality of rows and a plurality of columns, and a plurality of word lines, a respective one of which is connected to the nonvolatile memory cells in a respective one of the plurality of columns; the locking method comprising the steps of:

storing in a plurality of lockable cells, a respective one of which corresponds to a respective one of the plurality of word lines, one of a first binary value which indicates that the nonvolatile memory cells which are connected to the corresponding column of word lines cannot be erased or reprogrammed, or a second binary value which indicates that the nonvolatile memory cells which are connected to the corresponding column of word lines can be erased or programmed;

preventing erasure or programming of a column of nonvolatile memory cells if the lockable cell corresponding to the column of nonvolatile memory cells stores therein the first binary value; and allowing erasure or programming of a column of nonvolatile memory cells if the lockable cell corresponding to the column of nonvolatile memory cells stores therein the second binary value.

10. A method according to claim 9, further comprising the step of:

storing the first binary value in the lockable cell corresponding to the selected word line, in response to an erase lock command for a selected word line.

11. A method according to claim 10 further comprising the step of:

storing the second binary value in the lockable cell corresponding to the selected word line in response to an erase unlock command for a selected word line.

12. A method according to claim 9 wherein the step of allowing erasure comprises the step of:

erasing or programming a column of nonvolatile memory cells if the lockable cell corresponding to the column of nonvolatile memory cells stores therein the second binary value.

13. A method according to claim 10 wherein the step of storing the first binary value in the lockable cell corresponding to the selected word line is preceded by the step of:

erasing and programming the column of nonvolatile memory cells corresponding to the selected word line.

14. A method according to claim 11 further comprising the following step:

erasing and programming the column of nonvolatile memory cells corresponding to the selected word line, in response to the erase unlock command.

15. A nonvolatile memory device comprising:

a memory cell array including a plurality of memory cell blocks, each including a plurality of memory cells arranged in a plurality of rows and columns, and a plurality of word lines, a respective one of which is connected to the memory cells in a respective one of the columns;

a plurality of lockable cells in each of said memory cell blocks, a respective one of the lockable cells being connected to a respective word line; and control means for performing an erase lock operation in response to a lock command by erasing and programming ones of the lockable and memory cells connected to a selected one of the word lines and applying a first voltage to a bit line of the lockable cell connected to the selected word line to allow the lockable cell connected to the selected word line to remain at a first state, and for performing an erase unlock operation in response to an unlock command by erasing and programming the lockable and memory cells connected to the selected word line and applying a second voltage to the bit line of the lockable cell connected to the selected word line to change the state of the lockable cell connected to the selected word line from the first state to a second state.

16. A nonvolatile memory device according to claim 15, wherein the control means includes:

a sense buffer which senses the state of the lockable cell connected to the selected word line in response to a program or erase command; and a lock control circuit which reads the state sensed by the sense buffer and which generates the first or second voltage in response to the lock or unlock command.

17. A nonvolatile memory device according claim 16, wherein the memory cells connected to the selected word line cannot be erased and programmed while the lockable cell connected to the selected word line remains at the first state and can be erased and programmed while the lockable cell connected to said selected word line remains at the second state.

18. A method of performing erase lock/unlock operations for a nonvolatile memory device which comprises a memory cell array including a plurality of memory cell blocks, each including a plurality of memory cells arranged in a plurality of rows and columns, and a plurality of word lines, a respective one of which is connected to the memory cells in a respective one of the columns, the method comprising the steps of:

setting a plurality of lockable cells in each of the memory cell blocks such that the respective control gates thereof are connected to the respective word lines;

performing the erase lock operation in response to a lock command by erasing and programming ones of the lockable and memory cells connected to a selected one of the word lines, and by applying a first voltage to a bit line of the lockable cell connected to the selected word line to allow the lockable cell connected to the selected word line to remain at a first state; and performing the erase unlock operation in response to an unlock command by erasing and programming the lockable and memory cells connected to the selected word line, and by applying a second voltage to the bit line of the lockable cell connected to the selected word line to change the state of the lockable cell connected to the selected word line from the first state to a second state.

19. A method according to claim 18, wherein the memory cells connected to the selected word line cannot be erased and programmed while the lockable cell connected to the selected word line is in the first state and can be erased and programmed while the lockable cell connected to the selected word line is in the second state.

* * * * *